United States Patent [19]
Takekoshi et al.

[11] Patent Number: 4,604,521
[45] Date of Patent: Aug. 5, 1986

[54] OPTICAL ABSOLUTE ENCODER

[75] Inventors: Yoshitaka Takekoshi, Hachioji; Shigeyuki Ushiyama, Hino, both of Japan

[73] Assignee: Fanuc Limited, Hino, Japan

[21] Appl. No.: 624,504

[22] PCT Filed: Oct. 18, 1983

[86] PCT No.: PCT/JP83/00362
§ 371 Date: Jun. 18, 1984
§ 102(e) Date: Jun. 18, 1984

[87] PCT Pub. No.: WO84/01651
PCT Pub. Date: Apr. 26, 1984

[30] Foreign Application Priority Data
Oct. 18, 1982 [JP] Japan .................. 57-181471

[51] Int. Cl.$^4$ ............................................. G01D 5/34
[52] U.S. Cl. ........................ 250/231 SE; 340/347 P
[58] Field of Search ........ 250/231 SE, 237 G, 237 R; 340/347 P; 356/395

[56] References Cited
U.S. PATENT DOCUMENTS 4,266,125  5/1981  Epstein et al. ................. 250/231 SE
4,410,798 10/1983  Breslow ..................... 340/347 P X
4,423,958  1/1984  Schmitt ..................... 250/231 SE X
4,445,110  4/1984  Breslow ..................... 250/231 SE X Primary Examiner—Eugene R. Laroche
Assistant Examiner—Steven J. Mottola
Attorney, Agent, or Firm—Armstrong, Nikaido, Marmelstein & Kubovcik

[57] ABSTRACT

An optical absolute endoder, provided with a rotary code plate and fixed plate, for detecting the angle of rotation and the position of rotation of a motor, etc. The rotary code plate has a plurality of concentric code patterns with light passage portions and light blocking portions alternately arranged and a reference pattern comprised of just a light passage portion sandwiched between adjoining code patterns and arranged concentrically with the code patterns. The fixed plate is provided with first and second code pattern slit groups arranged in the radial direction of the rotary code plate at first predetermined intervals and corresponding to the code patterns and with reference pattern light passage portions provided at positions corresponding to the reference pattern at positions separated by exactly second predetermined intervals from the center line of the code pattern light groups. By this, fluctuations in the voltage level of the reference signals due to light leakage are prevented.

6 Claims, 8 Drawing Figures

Fig. 1 PRIOR ART
Fig. 2 PRIOR ART
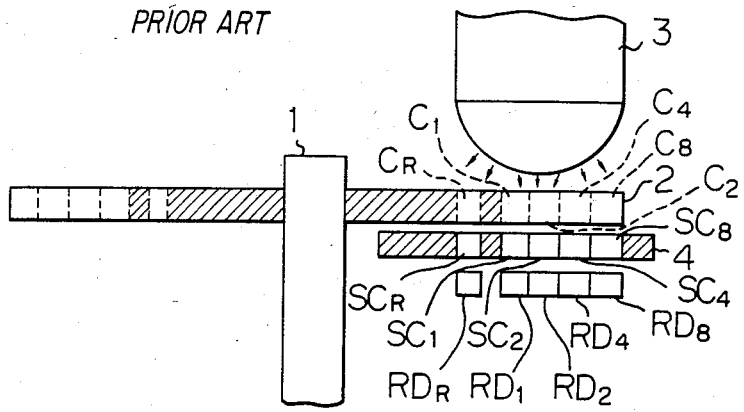
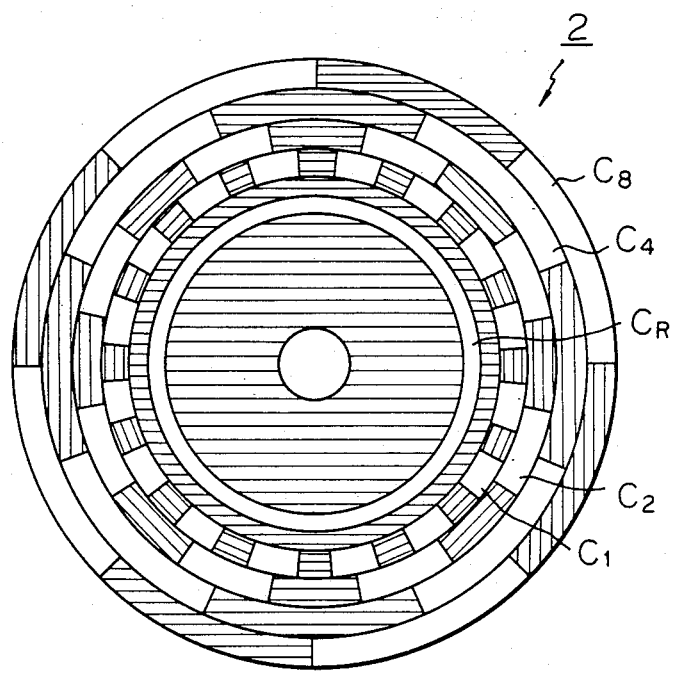

OPTICAL ABSOLUTE ENCODER

TECHNICAL FIELD

The present invention relates to an optical absolute encoder, more particularly to an optical absolute encoder wherein fluctuations in the voltage level of reference signals due to leakage of light are prevented.

BACKGROUND ART

In general, optical absolute encoders are provided with a light emitting element, a rotary code plate and fixed plate, for example, affixed to a motor shaft, and light receiving elements. That part of the light from the light emitting element passing through light passage portions provided in the rotary code plate and slits provided in the fixed plate is converted into electric signals by the light receiving elements, thereby allowing detection of the angle of rotation and the position of rotation of the motor, etc. The light passage portions of the rotary code plate are comprised of a plurality of concentric code patterns and a reference pattern. The slits of the fixed plate are provided corresponding to the code patterns and reference pattern.

Conventionally, the slits provided in the fixed plate have been arranged in a line in the radial direction of the rotary code plate. Therefore, light passing through the code patterns also leaks to the slits corresponding to the reference pattern. As a result of this, there have been the problems that the voltage level of the reference signals fluctuates and errors are caused in the output signals.

DISCLOSURE OF THE INVENTION

The object of the present invention is, in consideration of the above problems in the prior art, to prevent fluctuations in the voltage level of reference signals due to leakage of light in an optical absolute encoder, and thus to prevent errors in output signals, based on the idea of arranging those slits provided on the fixed plate which correspond to the reference pattern in the direction of rotation of the rotary code plate.

The gist of the present invention, for achieving the above object, lies in an optical absolute encoder provided with a rotary code plate having a plurality of concentric code patterns with light passage portions, for passing light from the light emitting element, and light blocking portions alternately arranged on the same circle and having a reference pattern comprised of just a light passage portion arranged concentrically with said code patterns; a fixed plate provided with light passage slits provided corresponding to the code patterns and reference pattern of the rotary code plate; and light receiving elements for receiving light from the light emitting element passing through the light passage portions of the rotary code plate and the light passage portions of the fixed plates, the optical absolute encoder being characterized in that the reference pattern included on the rotary code plate is arranged sandwiched between two adjoining code patterns and in that the fixed plate is provided with two code pattern slit groups arranged at first predetermined intervals in correspondence with said code patterns in the radial direction of said rotary code plate and reference pattern light passage portions arranged at positions corresponding to the reference pattern at positions separated by exactly second predetermined intervals from the center line of the code pattern light groups.

BRIEF DESCRIPTION OF THE DRAWINGS

The above objects and features of the present invention and other features of the same will become clearer from the following description of an embodiment in reference to the attached figures.

FIG. 1 is a schematic side view of a conventional optical absolute encoder;

FIG. 2 is a plan view of the rotary code plate shown in FIG. 1;

BEST MODE FOR CARRYING OUT THE INVENTION

Below, an explanation is given of an embodiment of the present invention in reference to the drawings and in comparison with the prior art.

First, an explanation will be given in reference to FIG. 1 to FIG. 5 of an example of the prior art and the problems thereof.

FIG. 1 is a schematic side view of a conventional optical absolute encoder. In the figure, a light emitting element 3 such as a light emitting diode is provided for a rotary code plate 2 affixed to a shaft 1 of a motor. A fixed plate 4 is provided under the rotary code plate 2. The rotary code plate 2 is provided with code patterns $C_8$, $C_4$, $C_2$, and $C_1$ and reference pattern $C_R$. The fixed plate 4 is provided with slits $SC_8$, $SC_4$, $SC_2$, $SC_1$, and $SC_R$ corresponding to the code patterns and reference pattern of the rotary code plate 2. Underneath the fixed plate 4 is provided light receiving elements $RD_8$, $RD_4$, $RD_2$, and $RD_R$ for receiving light passing through the slits $SC_8$, $SC_4$, $SC_2$, $SC_1$, and $SC_R$ of the fixed plate and converting them into electric signals.

FIG. 2 is a plan view of the conventional rotary code plate 2 shown in FIG. 1. In the figure, the slanted line areas indicate light blocking portions, while the non-slanted line areas indicate light passage portions. Code patterns $C_8$, $C_4$, $C_2$, and $C_1$ are provided concentrically from the outside, in that order, while a reference pattern $C_R$ is provided inside of the code pattern $C_1$. The code patterns $C_8$, $C_4$, $C_2$, and $C_1$ each are formed by alternate arrangements of light passage portions and light blocking portions on the same circle. The reference pattern $C_R$ is formed of only a light passage portion.

Figure 3:
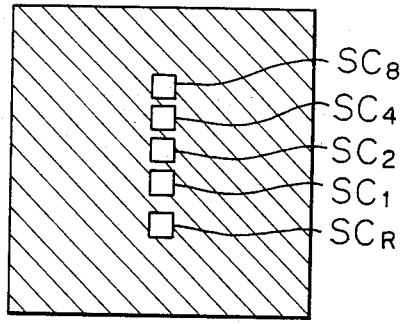
FIG. 3 is a plan view of the fixed plate shown in FIG. 1.

FIG. 3 is a plan view of the conventional fixed plate 4 shown in FIG. 1. As shown in the figure, the fixed plate 4 is provided with light passage slits $SC_4$, $SC_2$, $SC_1$, and $SC_R$ provided on a block-shaped light blocking plate. The slits $SC_8$ to $SC_1$ and $SC_R$ are correspondingly arranged as shown in FIG. 1 so that they pass light passing through the light passage portions of the code patterns $C_8$ to $C_1$ and the reference pattern $C_R$ of the rotary code plate 2.

Of the light emitted from the light emitting element 3, the light passing through the light passage portions of the code patterns $C_8$ to $C_1$ and the slits $SC_8$ to $SC_1$ strikes the light receiving elements $RD_8$ to $RD_1$ and is converted to electric signals. These electric signals are compared with the output signals of the light receiving element $RD_R$ which receives the light passing through the reference pattern $C_R$ and the slit $SC_R$ and converts it into electric signals.

Figure 4:
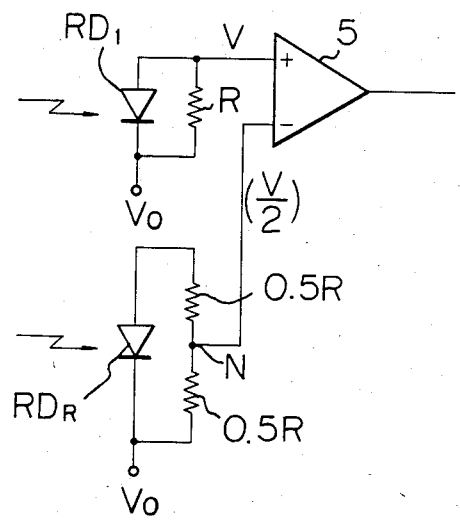
FIG. 4 is a circuit diagram of an example of a comparison circuit for comparing output signals of light receiving elements in the optical absolute encoder of FIG. 1.
Figure 5:
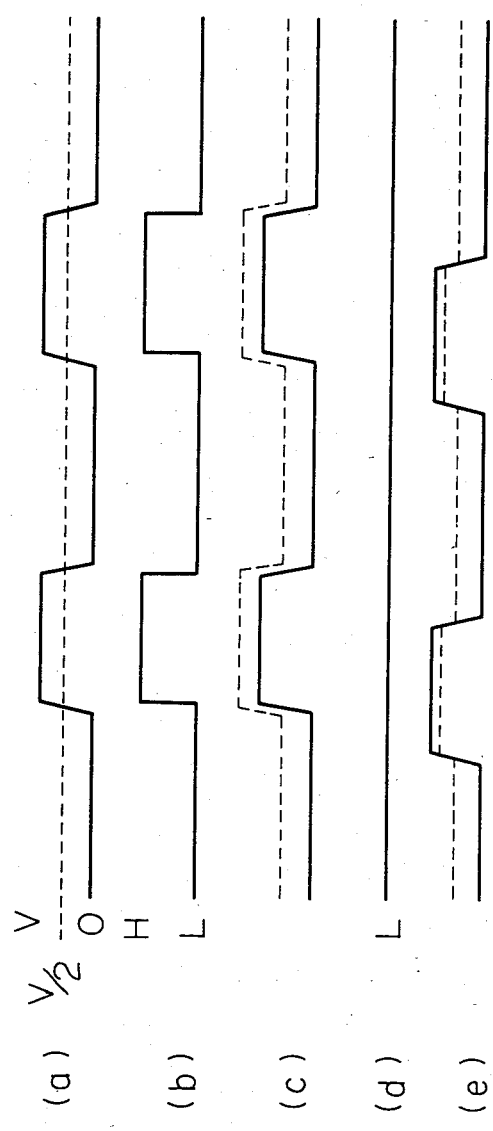
FIG. 5 is a waveform diagram of input and output signals of the comparison circuit of FIG. 4.

FIG. 4 is a circuit diagram of an example of a comparison circuit for comparing the output signals of the light receiving element $RD_1$ with the output signals of the light receiving element $RD_R$. In the figure, a resistor of resistance R is connected in parallel with light receiving element $RD_1$ receiving light passing through the code pattern $C_1$. The anode of the light receiving element $RD_1$ is connected to a first input of a comparator 5, while the cathode is fixed to a fixed voltage $V_O$. Two series-connected resistors of 0.5R resistances are connected in parallel with a light receiving element $RD_R$ receiving light passing through the reference pattern $C_R$. The connection point N of said two resistors is connected to the second input of the comparator 5, while the cathode of the light receiving element $RD_R$ is fixed at the constant voltage $V_O$.

The reference pattern $C_R$ is comprised only of a light passage portion, therefore ideally a fixed amount of light is always applied to the light receiving element $RD_R$ during rotation of the rotary code plate 2. The code pattern $C_1$ has alternately arranged light passage portions and light blocking portions, therefore the light receiving element $RD_1$ receives intermittent light during rotation of the rotary code plate 2. The ideal amount of light received per unit time of the light receiving element $RD_R$ is equal to the amount of light received per unit time when the light receiving element $RD_1$ receives light. Therefore, the voltages across the two ends of the light receiving elements $RD_1$ and $RD_R$ when they receive light are ideally the same. A voltage divided into half by the two resistors is applied to the second input of the comparator 5, therefore, ideally, if the voltage of the first input of the comparator 5 is V at light reception, then the voltage of the second input is V/2. This relation does not change even if the light emitting element deteriorates and the amount of light emitted declines.

The solid line waveform and the dotted line waveform of FIG. 5(a) are waveforms of voltages of the first input and second input of the comparator 5 of FIG. 4 in the ideal case. As shown in the figure, ideally, the voltage difference V in the first input of the comparator 5 between the time of light reception and the time of light blocking is twice that of the reference voltage V/2 in the second input of the comparator 5. The comparator 5 discriminates this and the output waveform shown in FIG. 5(b) is obtained.

However, the light emitting element 3, as shown in FIG. 1, is devised so that its edges are formed in a convex lens shape and so that parallel light rays are emitted. The convex lens shaped edge portions are formed by the simple process of melting the glass and then utilizing distortion due to gravity. Consequently, the curvature is not constant and parallel light rays are not necessarily emitted. As a result, part of the light passing through the code patterns may pass through the slit $SC_R$ corresponding to the reference pattern and be received by the light receiving element $RD_R$. If light passing through the code patterns is radiated and input to the reference pattern light receiving element $RD_R$, the voltage across its ends will increase and the voltage of the second input of the comparator 5 will fluctuate. Thus, as shown in FIG. 5(e), light from the code pattern $C_1$ will strike the light receiving element $RD_R$ too while the light receiving element $RD_1$ is receiving light, resulting in the voltage of the first input of the comparator 5 always being lower than the voltage of the second input and, as shown in FIG. 5(d), the output of the comparator 5 will become a low level even while the light receiving element $RD_1$ is receiving light. Further, even when the fluctuation of the second input 2 is small, the output of the comparator 5 will include error (see FIG. 5(e)).

To avoid such error in the output signals, the conventional practice has been to provide a convex lens between the light emitting element 3 and the rotary code plate 2 so as to have parallel light rays strike the rotary code plate 2. There are problems, however, in that a convex lens is expensive, the positioning of the light emitting element with the convex lens is difficult, etc.

Next, an explanation will be given of an embodiment of the present invention.

Figure 6:
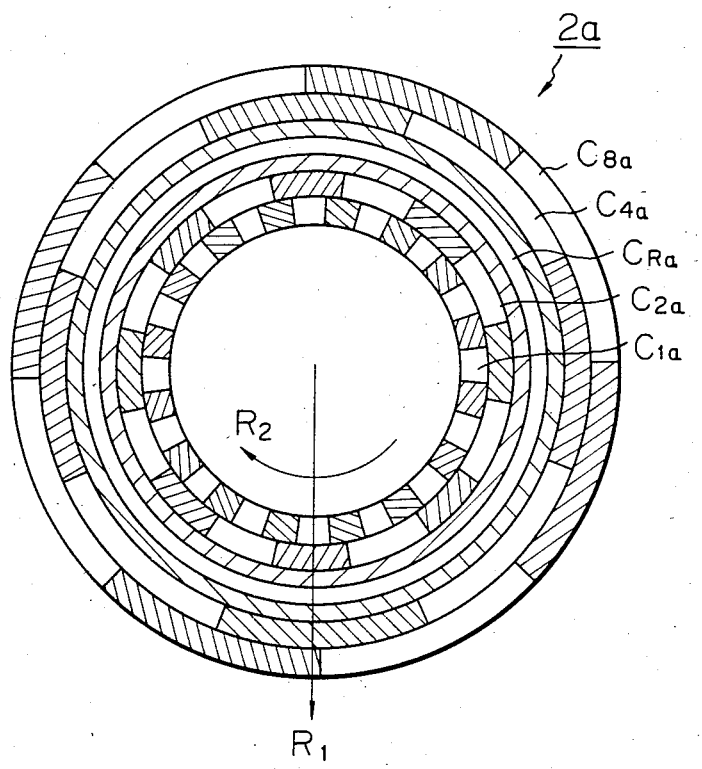
FIG. 6 is a plan view of a rotary code plate included in an optical absolute encoder according to an embodiment of the present invention.

FIG. 6 is a plan view of a rotary code plate according to an embodiment of the present invention. In the figure, a rotary code plate 2a is provided with code patterns $C_{8a}$, $C_{4a}$, $C_{2a}$, and $C_{1a}$ and a reference pattern $C_{Ra}$. The reference pattern $C_{Ra}$ is positioned between the code patterns $C_{2a}$ and $C_{4a}$. The forms of the patterns of the code patterns $C_{8a}$ to $C_{1a}$ and the reference pattern $C_{Ra}$ are the same as in the prior art shown in FIG. 2.

Figure 7:
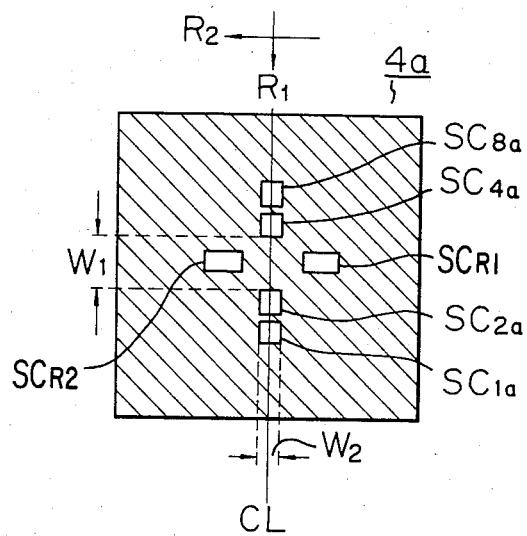
FIG. 7 is a plan view of a fixed plate included in an optical absolute encoder according to the embodiment of the present invention.

FIG. 7 is a plane view of a fixed plate provided underneath the rotary code plate 2a shown in FIG. 6. In the figure, the fixed plate 4a is provided with a code pattern slit group comprising code pattern slits $SC_{8a}$, $SC_{4a}$, $SC_{2a}$, $SC_{1a}$ arranged corresponding to the code patterns $C_{8a}$, $C_{4a}$, $C_{2a}$, and $C_{1a}$ in the radial direction $R_1$ of the rotary code plate 2a. Between the slit $SC_{4a}$ and the slit $SC_{2a}$ there is a first predetermined interval $W_1$ corresponding to the width in the above radial direction of the reference pattern $C_{Ra}$. The fixed plate 4a further is provided with reference pattern slits $SC_{R1}$ and $SC_{R2}$ provided corresponding to the reference pattern $C_{Ra}$ of the rotary code plate 2a. The reference pattern slits $SC_{R1}$ and $SC_{R2}$ are provided at intervals twice that width $W_2$ of, for example, the code pattern slits $SC_{8a}$ to $SC_{1a}$ in the direction of rotation $R_2$ of the rotary code plate 2a and are arranged symmetrically with respect to the center line CL of the code pattern slit group comprising $SC_{8a}$ to $SC_{1a}$. The second predetermined interval $W_2$ of the reference pattern slits $SC_{R1}$ and $SC_{R2}$ should be at least larger than the width in the above-mentioned direction of rotation of the code pattern slits.

Due to the construction shown in FIG. 6 and FIG. 7, light passing through the code patterns almost never reaches the reference pattern slits $SC_{R1}$ and $SC_{R2}$ of the fixed plate 4a. Therefore, the output signals of the optical absolute encoder almost never have any error due to light leakage. Light receiving elements are provided beneath the code pattern slits and the reference pattern slits.

Figure 8:
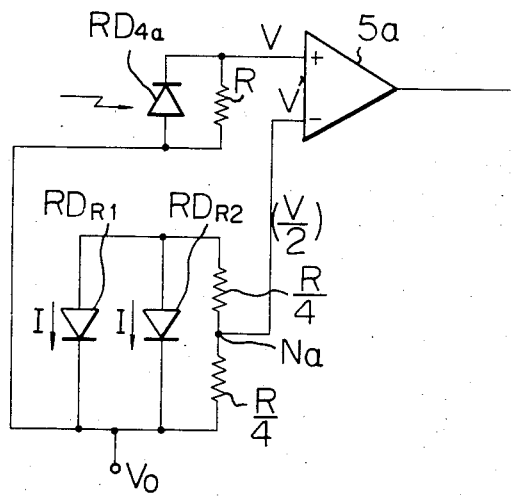
FIG. 8 is a circuit diagram of an example of a comparison circuit for comparing output signals of light receiving elements in an optical absolute encoder according to the embodiment of the present invention.

FIG. 8 is a circuit diagram of an embodiment of a comparison circuit for comparing the output signals of the light receiving element $RD_{4a}$ under the code pattern slit $SC_{4a}$ and the output signals of the light receiving elements $RD_{R1}$ and $RD_{R2}$ under the reference pattern slits $SC_{R1}$ and $SC_{R2}$. In the figure, the light receiving elements $RD_{R1}$ and $RD_{R2}$ are connected in parallel. Two series-connected resistors of resistances R/4 are connected to the anodes of $RD_{R1}$ and $RD_{R2}$ and the cathodes of $RD_{R1}$ and $RD_{R2}$. The anode of the light receiving element $RD_{4a}$ is connected to the first input of the comparator 5a, while the connection point Na of the two resistors is connected to the second input.

The light receiving elements $RD_{R1}$ and $RD_{R2}$ receive only light passing through the reference pattern $C_{Ra}$ and do not receive any light from the code patterns, therefore, the light receiving element $RD_{R1}$ and the light receiving element $RD_{R2}$ each always generate currents of a constant value I. Therefore, the voltage between the anodes of the light receiving elements $RD_{R1}$ and $RD_{R2}$ and the cathodes of $RD_{R1}$ and $RD_{R2}$ is always a constant value V. Almost no current flows in the direction of the comparator 5a. Consequently, a current of 2I flows to the two resistors of resistances R/4. Due to resistance division, the voltage V' of the second input of the comparator 5a is always V/2. When light passing through the light passage portions of the code pattern $C_{4a}$ is received by the light receiving element $RD_{4a}$, the voltage of the first input of the comparator 5a becomes V and the output of the comparator 5a becomes the H level. When light is blocked by the light blocking portions of the code pattern $C_{4a}$ and the light receiving element $RD_{4a}$ does not receive any light, the voltage of the first input of the comparator 5a is zero. Consequently, the output of the comparator 5a becomes the L level.

The light receiving elements $RD_{4a}$, $RD_{R1}$, and $RD_{R2}$ are PN type photodiodes, more specifically, photodiodes of a silicon material including PN junctions.

The above embodiment showed an example having four code patterns. The present invention, however, is not limited to this. Further, the means for comparing the light passing through the code patterns and the light passing through the reference pattern is not limited to that of FIG. 8 and may be a comparison means of another other type. Still further, the above embodiment showed an example where two reference pattern slits were provided in the fixed plate. The present invention, however, is not limited to this. A single reference pattern light slit may also be arranged exactly a width W of the code pattern slit apart from the center line CL of the code pattern slit group. In this case, there is, of course, one light receiving element corresponding to the reference pattern slit in the comparison circuit.

CAPABILITY OF EXPLOITATION IN INDUSTRY

As explained above, according to the present invention, the rotary code plate and fixed plate are devised so that light leakage from other code patterns to a reference pattern slits is prevented in an optical absolute encoder, whereby the effects are obtained that fluctuations of the voltage level of the reference signals are eliminated and an expensive lens need not be used. This is extremely advantageous for detecting the angle of rotation and the position of rotation of a motor, etc.

We claim:

1. An optical absolute encoder provided with:
    a light emitting element;
    a rotary code plate having a plurality of concentric code patterns with light passage portions, for passing light from said light emitting element, and light blocking portions alternately arranged on the same circle and having a reference pattern comprised of just a light passage portion arranged concentrically with said code patterns;
    a fixed plate provided with light passage slits provided corresponding to said code patterns and reference pattern of said rotary code plate; and
    light receiving elements for receiving light from said light emitting element passing through the light passage portions of said rotary code plate and the light passage portions of said fixed plate;
    the optical absolute encoder being characterized in that:
    said reference pattern included on said rotary code plate is arranged sandwiched between two adjoining code patterns and in that
    said fixed plate is provided with:
        first and second code pattern slit groups arranged at first predetermined intervals and in correspondence with said code patterns in the radial direction of said rotary code plate and
        reference pattern light passage portions arranged at positions corresponding to said reference pattern at positions separated by exactly second predetermined intervals from the center line of said code pattern light groups.

2. An optical absolute encoder according to claim 1, wherein said first predetermined intervals are larger than the width of said reference pattern in said radial direction.

3. An optical absolute encoder according to claim 2, wherein said second predetermined intervals are larger than half the width of said code pattern slits in the direction of rotation of said rotary code plate.

4. An optical absolute encoder according to claims 3, wherein said reference pattern light passage portions are provided with first and second reference pattern slits arranged in the direction of rotation of said rotary code plate at intervals twice said predetermined intervals and symmetrically with respect to the direction of arrangement of said code pattern slit groups.

5. An optical absolute encoder according to claim 4, wherein said first and second code pattern slit groups are each comprised of a plurality of code pattern slits.

6. An optical absolute encoder according to claim 5, further comprised of means for obtaining a reference voltage from a voltage generated across ends of light receiving elements receiving light passing through said first and second reference pattern slits and means for comparing voltage generated across ends of light receiving elements receiving light passing through each of said code pattern slits with said reference voltage.

* * * * *